US009671646B1

(12) United States Patent
Tang (10) Patent No.: US 9,671,646 B1
(45) Date of Patent: Jun. 6, 2017

(54) METHOD FOR MANUFACTURING EYE-PROTECTING LIQUID CRYSTAL DISPLAY DEVICE

(71) Applicant: Wuhan China Star Optoelectronics Technology Co., Ltd., Wuhan (CN)

(72) Inventor: Guoqiang Tang, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/166,273

(22) Filed: May 27, 2016

(30) Foreign Application Priority Data

Jan. 21, 2016 (CN) .......................... 2016 1 0040715

(51) Int. Cl.
*H01L 33/00* (2010.01)
*G02F 1/1335* (2006.01)
(Continued)

(52) U.S. Cl.
CPC ...... *G02F 1/133621* (2013.01); *G02F 1/1341* (2013.01); *G02F 1/1368* (2013.01); *G02F 1/13394* (2013.01); *G02F 1/133345* (2013.01); *G02F 1/133512* (2013.01); *G02F 1/133516* (2013.01); *G02F 1/136209* (2013.01); *H01L 27/127* (2013.01); *H01L 27/1222* (2013.01);
(Continued)

(58) Field of Classification Search
CPC ............. H01L 27/1222; H01L 27/1248; H01L 27/127; H01L 27/66757; G02F 1/133621; G02F 1/136209; G02F 1/1368; G02F 1/133345; G02F 1/133516; G02F 1/133512; G02F 1/13394; G02F 1/1341; G02F 2001/13685; G02F 2001/133357; G02F 2001/133614; G02F 2202/02136; G02F 2032/055; G02F 2201/086
See application file for complete search history.

(56) References Cited

U.S. PATENT DOCUMENTS 5,510,916 A * 4/1996 Takahashi ......... G02F 1/136213
349/110
2007/0216832 A1* 9/2007 Takahashi ......... G02F 1/133516
349/106

(Continued)

*Primary Examiner* — Dale E Page
*Assistant Examiner* — Quovaunda V Jefferson
(74) *Attorney, Agent, or Firm* — Leong C. Lei (57) ABSTRACT

A method for manufacturing an eye-protecting liquid crystal display device is disclosed, in which an ultraviolet light emitting material and a ultraviolet absorbent are added in a first planarization layer of an array substrate and a second planarization layer of a color filter substrate. The ultraviolet absorbent absorbs short-wavelength blue light having a wavelength less than 400 nm and ultraviolet light emitting from a backlight module. The short-wavelength blue light and the ultraviolet light so absorbed excite the ultraviolet light emitting material to give off long-wavelength visible blue light having a wavelength greater than 400 nm. The first and second planarization layers are thus useful in converting ultraviolet light and short-wavelength blue light having a wavelength less than 400 nm, which could damage human eyes, into long-wavelength visible blue light having a wavelength greater than 400 nm that does not damage human eyes.

14 Claims, 8 Drawing Sheets

(51) Int. Cl.
*H01L 27/12* (2006.01)
*G02F 1/1362* (2006.01)
*H01L 29/66* (2006.01)
*G02F 1/1368* (2006.01)
*G02F 1/1333* (2006.01)
*G02F 1/1339* (2006.01)
*G02F 1/1341* (2006.01)

(52) U.S. Cl.
CPC .... *H01L 27/1248* (2013.01); *H01L 29/66757* (2013.01); *G02F 2001/13685* (2013.01); *G02F 2001/133357* (2013.01); *G02F 2001/133614* (2013.01); *G02F 2201/086* (2013.01); *G02F 2202/02* (2013.01); *G02F 2202/36* (2013.01); *G02F 2203/055* (2013.01)

(56) References Cited

U.S. PATENT DOCUMENTS

| | | | |
|---|---|---|---|
| 2010/0222473 A1* | 9/2010 | Youn | G02F 1/133345 524/105 |
| 2011/0199564 A1* | 8/2011 | Moriwaki | G02F 1/136227 349/122 |

* cited by examiner

METHOD FOR MANUFACTURING EYE-PROTECTING LIQUID CRYSTAL DISPLAY DEVICE

BACKGROUND OF THE INVENTION

1. Field of the Invention

The present invention relates to the field of display technology, and in particular to a method for manufacturing an eye-protecting liquid crystal display device.

2. The Related Arts

With the progress of the display technology, flat panel display devices, such as liquid crystal displays (LCDs), due to various advantages, such as high image quality, low power consumption, thin device body, and wide range of applications, have been widely used in all sorts of consumer electronic products, including mobile phones, televisions, personal digital assistants (PDAs), digital cameras, notebook computers, and desktop computers, making them the main stream of display devices.

Most of the liquid crystal display devices that are currently available in the market are backlighting LCDs, which comprise a liquid crystal display panel and a backlight module. The working principle of the liquid crystal display panel is that liquid crystal molecules are disposed between two parallel glass substrates and multiple vertical and horizontal tiny conductive wires are arranged between the two glass substrates, wherein the liquid crystal molecules are controlled to change directions through application of electricity in order to refract out light emitting from the backlight module to generate an image.

The liquid crystal display panel is generally made up of a color filter (CF) substrate, a thin-film transistor (TFT) substrate, liquid crystal (LC) interposed between the CF substrate and the TFT substrate, and sealant and is generally manufactured with a process involving an anterior stage of array engineering (for thin film, photolithography, etching, and film peeling), an intermediate stage of cell engineering (for lamination of the TFT substrate and the CF substrate), and a posterior stage of module assembly (for combining a drive integrated circuit (IC) and a printed circuit board). Among these stages, the anterior stage of array engineering generally involves the formation the TFT substrate for controlling the movement of liquid crystal molecules; the intermediate stage of cell engineering generally involves filling liquid crystal between the TFT substrate and the CF substrate; and the posterior stage of module assembly generally involves the combination of the drive IC and the printed circuit board for driving the liquid crystal molecules to rotate for displaying of images.

The advance of science and technology makes people rely strongly on the liquid crystal display devices and people are paying more attention to the potential threat of liquid crystal displays to human bodies. The liquid crystal display devices may emit blue light of short wavelength, which carries energy that is just less than that of ultraviolet light and may easily transmit though eyeballs and reach retinas so as to cause certain damage to human eyes. Liquid crystal displays with eye protecting functions are currently available, which comprise a blue light resistant protection film attached to a light emission side of a liquid crystal display panel to filter off blue light having a wavelength less than 400 nm. However, such blue light resistant protection film also lowers down display brightness of the liquid crystal display panel and thus affects the backlighting efficiency and transmittance of the liquid crystal display device.

Thus, it is desired to provide a method for manufacturing an eye-protecting liquid crystal display device that alleviates the drawbacks of the prior art.

SUMMARY OF THE INVENTION

An object of the present invention is to provide a method for manufacturing an eye-protecting liquid crystal display device, which converts ultraviolet light and short-wavelength blue light having a wavelength less than 400 nm, which could damage human eyes, into long-wavelength visible blue light having a wavelength greater than 400 nm that does not damage human eyes so that human eyes can be protected, while display brightness of a liquid crystal display panel does not deteriorate and backlighting efficiency and transmittance of the liquid crystal display device can be ensured.

To achieve the above object, the present invention provides a method for manufacturing an eye-protecting liquid crystal display device, which comprises the following steps:

(1) preparing an array substrate, wherein the array substrate comprises a first backing plate; a light-shielding layer located on the first backing plate; a buffer layer located on the light-shielding layer and the plate; a first poly-silicon section and a second poly-silicon section located on the buffer layer; a gate insulation layer located on the first poly-silicon section, the second poly-silicon section, and the buffer layer; a first gate electrode and a second gate electrode located on the gate insulation layer; an interlayer insulation layer located on the first gate electrode, the second gate electrode, and the gate insulation layer; a first source electrode, a first drain electrode, a second source electrode, and a second drain electrode located on the interlayer insulation layer; a first planarization layer located on the first source electrode, the first drain electrode, the second source electrode, the second drain electrode, and the interlayer insulation layer; a common electrode located on the first planarization layer; a passivation layer located on the common electrode and the first planarization layer; and a pixel electrode located on the passivation layer, wherein the first planarization layer comprises an ultraviolet light emitting material and an ultraviolet absorbent;

(2) preparing a color filter substrate, wherein the color filter substrate comprises a second backing plate; a black matrix arranged on the second backing plate; a color resist layer arranged on the black matrix and the second backing plate; a second planarization layer arranged on the color resist layer; and a plurality of photo spacers arranged on the second planarization layer, wherein the second planarization layer comprises an ultraviolet light emitting material and an ultraviolet absorbent; and (3) laminating the array substrate and the color filter substrate to each other and filling liquid crystal molecules between the array substrate and the color filter substrate, followed by sealing, to form an eye-protecting liquid crystal display panel; and providing a backlight module and combining the eye-protecting liquid crystal display panel and the backlight module together to form an eye-protecting liquid crystal display device;

wherein the ultraviolet absorbents contained in the first planarization layer of the array substrate and the second planarization layer of the color filter substrate absorb short-wavelength blue light having a wavelengths less than 400 nm and ultraviolet light emitting from the backlight module; and the short-wavelength blue light and the ultraviolet light so absorbed excite the ultraviolet light emitting materials to give off long-wavelength visible blue light having a wavelength greater than 400 nm, so as to provide a function of eye protection, while avoiding lowering display brightness of the liquid crystal display panel thereby ensuring the backlighting efficiency and transmittance of the liquid crystal display device.

The ultraviolet light emitting materials comprise an inorganic ultraviolet light emitting material or an organic ultraviolet light emitting material.

The inorganic ultraviolet light emitting material comprises one of 3Ca3(PO4)2.Ca(F,Cl)2:Sb,Mn, Y2O3:Eu, MgAl11O19:Ce,Tb, BaMg2Al16O27:Eu, manganese activated magnesium fluogermanate powder, tin activated zinc-strontium phosphate powder, YVO4:Eu, Y(PV)O4:Eu, (BaSi2O3):Pb, (Ca, Zn)3(PO4)2:Tl, Sr2P2O7:Eu, MgGa2O4:Mn, and Zn2SiO4:Mn or a combination of multiple ones thereof.

The organic ultraviolet light emitting material comprises one of distyryl-biphenyl disulfonic acid sodium salt, 2,5-bis (5-tert butyl-2-benzoxazolyl) thiophene, 1-(p-sulfonamidophenyl)-3-(p-chlorophenyl)-2-pyrazoline, and phthalimide or a combination of multiple ones thereof.

The ultraviolet absorbents comprise an organic ultraviolet absorbent or an inorganic ultraviolet absorbent.

The organic ultraviolet absorbent comprises one of 2-(2'-hydroxy-3',5'-di-tert-butylphenyl)-5-chlorobenzotriazole, 2-hydroxy-4-n-octoxybenzophenone, 2-hydroxy-4-methoxybenophenone, 2(2-hydroxy-5-tert-octylphenyl)benzotriazole, and 2-(2'-hydroxy-3',5'-di-tert-amylphenyl)benzotriazole or a combination of multiple ones thereof.

The inorganic ultraviolet absorbent comprises one of nano-zinc oxide, nano-tin oxide, nano-indium tin oxide, and nano-tin antimony oxide or a combination of multiple ones thereof.

In step (1), a process for preparing the array substrate comprises the following steps:

(11) providing a first backing plate, depositing a first metal layer on the first backing plate, and subjecting the first metal layer to patterning treatment so as to form a light-shielding layer;

(12) forming a buffer layer on the light-shielding layer and the first backing plate, forming a poly-silicon layer on the buffer layer, applying a photolithographic operation to subject the poly-silicon layer to patterning treatment so as to form a first poly-silicon section located above and corresponding to the light-shielding layer and a second poly-silicon section spaced from the first poly-silicon section;

(13) subjecting a middle portion of the first poly-silicon section to P-type light doping so as to form a first channel zone, and then, subjecting two opposite end portions of the first poly-silicon section to N-type heavy doping to form N-type heavily doped zones respectively located at the two ends;

(14) depositing a gate insulation layer on the first poly-silicon section, the second poly-silicon section, and the buffer layer, depositing a second metal layer on the gate insulation layer, and subjecting the second metal layer to patterning treatment so as to form a first gate electrode and a second gate electrode respectively located above and corresponding to the first poly-silicon section and the second poly-silicon section;

(15) subjecting portions of the first poly-silicon section that are located between the first channel zone and the N-type heavily doped zones to N-type light doping so as to form lightly-doped zones, and then, subjecting two opposite end portions of the second poly-silicon section to P-type heavy doping to form P-type heavily doped zones respectively located at the two ends and a second channel zone located between the two P-type heavily doped zones;

(16) depositing an interlayer insulation layer on the first gate electrode, the second gate electrode, and the gate insulation layer, applying a photolithographic operation to subject the interlayer insulation layer and the gate insulation layer to patterning treatment so as to form, in the interlayer insulation layer and the gate insulation layer, first vias respectively located above and corresponding to the N-type heavily doped zones and second vias respectively located above and corresponding to the P-type heavily doped zones;

(17) depositing a third metal layer on the interlayer insulation layer and subjecting the third metal layer to patterning treatment so as to form a first source electrode, a first drain electrode, a second source electrode, and a second drain electrode that are spaced from each other, wherein the first source electrode and the first drain electrode are respectively in engagement with the N-type heavily doped zones through the first vias and the second source electrode and the second drain electrode are respectively in engagement with the P-type heavily doped zones through the second vias;

(18) coating organic photoresist that comprises an ultraviolet light emitting material and an ultraviolet absorbent on the first source electrode, the first drain electrode, the second source electrode, the second drain electrode, and the interlayer insulation layer to form a first planarization layer and subjecting the first planarization layer to patterning treatment so as to form, in the first planarization layer, a third via located above and corresponding to the first drain electrode; and depositing a first transparent conductive layer on the first planarization layer and subjecting the first transparent conductive layer to patterning treatment so as to form a common electrode; and (19) forming a passivation layer on the common electrode and the first planarization layer, and then, subjecting the passivation layer to patterning treatment so as form a fourth via that is located in the third via and an inner wall of the fourth via belongs to the passivation layer; and depositing a second transparent conductive layer on the passivation layer and subjecting the second transparent conductive layer to patterning treatment so as to form a pixel electrode, wherein the pixel electrode is in engagement with the first drain electrode through the fourth via.

The first metal layer, the second metal layer, and the third metal layer are each form of a material comprising one of molybdenum, titanium, aluminum, and copper or a stacked combination of multiple ones thereof; the buffer layer, the gate insulation layer, and the interlayer insulation layer are each formed of a silicon oxide layer, a silicon nitride layer, or a composite layer comprising a silicon oxide layer and a silicon nitride layer stacked on each other; and the first transparent conductive layer and the second transparent conductive layer are each formed of a material comprising a transparent metal oxide.

In step (2), a process for preparing the color filter substrate comprises the following steps:

(21) providing a second backing plate, forming a black matrix on the second backing plate, and forming a color resist layer on the black matrix and the second backing plate; and (22) coating organic photoresist that contains an ultraviolet light emitting material and an ultraviolet absorbent on the color resist layer, forming a second planarization layer, and forming a plurality of photo spacers on the second planarization layer.

The efficacy of the present invention is that the present invention provides a method for manufacturing an eye-protecting liquid crystal display device, in which ultraviolet light emitting materials and the ultraviolet absorbents are added in the first planarization layer 70 of the array substrate 100 and the second planarization layer 240 of the color filter substrate 200 to allow the ultraviolet absorbents to absorb short-wavelength blue light having a wavelength less than 400 nm and ultraviolet light emitting from the backlight module and allow the short-wavelength blue light and the ultraviolet light so absorbed to excite the ultraviolet light emitting materials to give off long-wavelength visible blue light having a wavelength greater than 400 nm. In order other, the first planarization layer 70 and the second planarization layer 240 are useful in converting ultraviolet light and short-wavelength blue light having a wavelength less than 400 nm, which could damage human eyes, into long-wavelength visible blue light having a wavelength greater than 400 nm that does not damage human eyes so that human eyes can be protected, while the display brightness of the liquid crystal display panel does not deteriorate and backlighting efficiency and transmittance of the liquid crystal display device can be ensured.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of embodiments of the present invention, with reference to the attached drawing. In the drawing.

DETAILED DESCRIPTION OF THE PREFERRED EMBODIMENTS

To further expound the technical solution adopted in the present invention and the advantages thereof, a detailed description is given to a preferred embodiment of the present invention with reference to the attached drawings.

Figure 1:
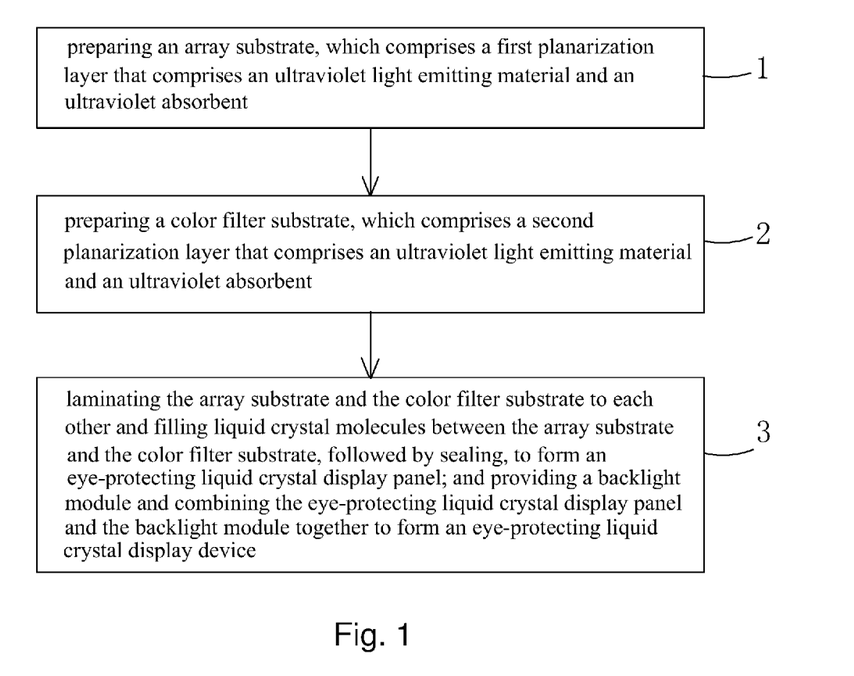
FIG. 1 is a flow chart illustrating a method for manufacturing an eye-protecting liquid crystal display device according to the present invention.
Figure 11:
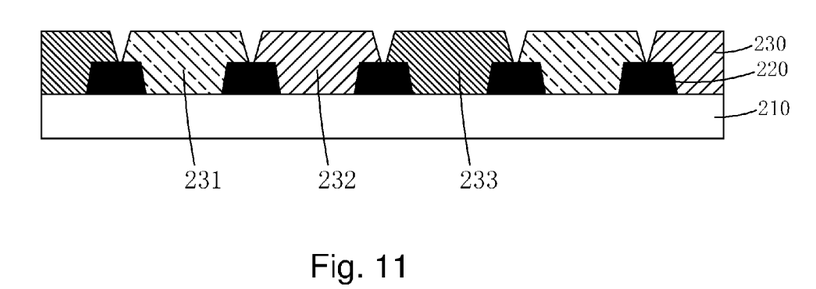
FIGS. 11-12 are schematic views illustrating step 2 of the method for manufacturing an eye-protecting liquid crystal display device according to the present invention.
Figure 12:
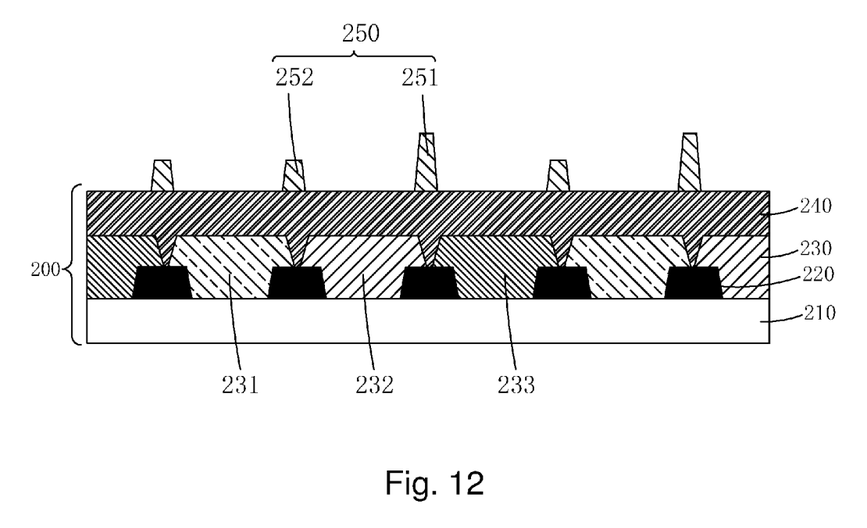
Figure 13:
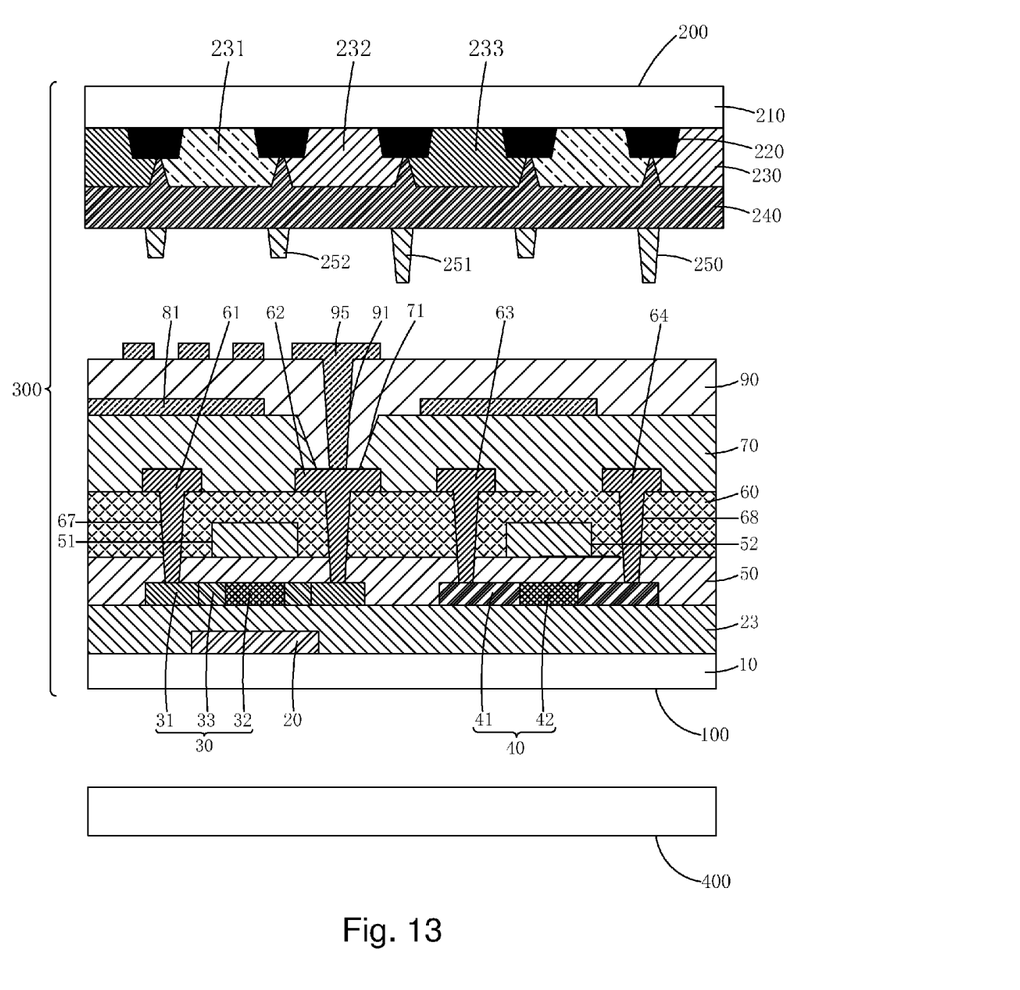
FIG. 13 is a schematic view illustrating step 3 of the method for manufacturing an eye-protecting liquid crystal display device according to the present invention.

Referring to FIG. 1, the present invention provides a method for manufacturing an eye-protecting liquid crystal display device, which comprises the following steps:

Step 1: referring to FIGS. 2-10, preparing an array substrate 100, wherein the array substrate 100 comprises a first backing plate 10; a light-shielding layer 20 located on the first backing plate 10; a buffer layer 23 located on the light-shielding layer 20 and the plate 10; a first poly-silicon section 30 and a second poly-silicon section 40 located on the buffer layer 23; a gate insulation layer 50 located on the first poly-silicon section 30, the second poly-silicon section 40, and the buffer layer 23; a first gate electrode 51 and a second gate electrode 52 located on the gate insulation layer 50; an interlayer insulation layer 60 located on the first gate electrode 51, the second gate electrode 52, and the gate insulation layer 50; a first source electrode 61, a first drain electrode 62, a second source electrode 63, and a second drain electrode 64 located on the interlayer insulation layer 60; a first planarization layer 70 located on the first source electrode 61, the first drain electrode 62, the second source electrode 63, the second drain electrode 64, and the interlayer insulation layer 60; a common electrode 81 located on the first planarization layer 70; a passivation layer 90 located on the common electrode 81 and the first planarization layer 70; and a pixel electrode 95 located on the passivation layer 90, wherein the first planarization layer 70 comprises an ultraviolet light emitting material and an ultraviolet absorbent;

Step 2: referring to FIGS. 11-12, preparing a color filter substrate 200, wherein the color filter substrate 200 comprises a second backing plate 210; a black matrix 220 arranged on the second backing plate 210; a color resist layer 230 arranged on the black matrix 220 and the second backing plate 210; a second planarization layer 240 arranged on the color resist layer 230; and a plurality of photo spacers 250 arranged on the second planarization layer 240, wherein the second planarization layer 240 comprises an ultraviolet light emitting material and an ultraviolet absorbent; and Step 3: referring to FIG. 13, laminating the array substrate 100 and the color filter substrate 200 to each other and filling liquid crystal molecules between the array substrate 100 and the color filter substrate 200, followed by sealing, to form an eye-protecting liquid crystal display panel 300; and providing a backlight module 400 and combining the eye-protecting liquid crystal display panel 300 and the backlight module 400 together to form an eye-protecting liquid crystal display device;

wherein the ultraviolet absorbents contained in the first planarization layer 70 of the array substrate 100 and the second planarization layer 240 of the color filter substrate 200 absorb short-wavelength blue light having a wavelengths less than 400 nm and ultraviolet light emitting from the backlight module 400; and the short-wavelength blue light and the ultraviolet light so absorbed excite the ultraviolet light emitting materials to give off long-wavelength visible blue light having a wavelength greater than 400 nm, so as to provide a function of eye protection, while avoiding lowering display brightness of the liquid crystal display panel thereby ensuring the backlighting efficiency and transmittance of the liquid crystal display device.

Specifically, the ultraviolet light emitting material can be an inorganic ultraviolet light emitting material or an organic ultraviolet light emitting material.

The inorganic ultraviolet light emitting material can be one of 3Ca3(PO4)2.Ca(F,Cl)2:Sb,Mn, Y2O3:Eu, MgAl11O19:Ce,Tb, BaMg2Al16O27:Eu, manganese activated magnesium fluogermanate powder, tin activated zinc-strontium phosphate powder, YVO4:Eu, Y(PV)O4:Eu, (BaSi2O3):Pb, (Ca, Zn)3(PO4)2:Tl, Sr2P2O7:Eu, MgGa2O4:Mn and Zn2SiO4:Mn or a combination of multiple ones thereof.

The organic ultraviolet light emitting material can be one of distyryl-biphenyl disulfonic acid sodium salt, 2,5-bis (5-tert butyl-2-benzoxazolyl) thiophene, 1-(p-sulfonami-dophenyl)-3-(p-chlorophenyl)-2-pyrazoline, and phthalimide or a combination of multiple ones thereof.

The ultraviolet absorbent can be an organic ultraviolet absorbent or an inorganic ultraviolet absorbent.

The organic ultraviolet absorbent can be one of 2-(2'-hydroxy-3',5'-di-tert-butylphenyl)-5-chlorobenzotriazole, 2-hydroxy-4-n-octoxybenzophenone, 2-hydroxy-4-methoxybenophenone, 2(2-hydroxy-5-tert-octylphenyl)benzotriazole, and 2-(2'-hydroxy-3',5'-di-tert-amylphenyl)benzotriazole or a combination of multiple ones thereof.

The inorganic ultraviolet absorbent can be one of nano-zinc oxide, nano-tin oxide, nano-indium tin oxide, and nano-tin antimony oxide or a combination of multiple ones thereof.

Figure 2:
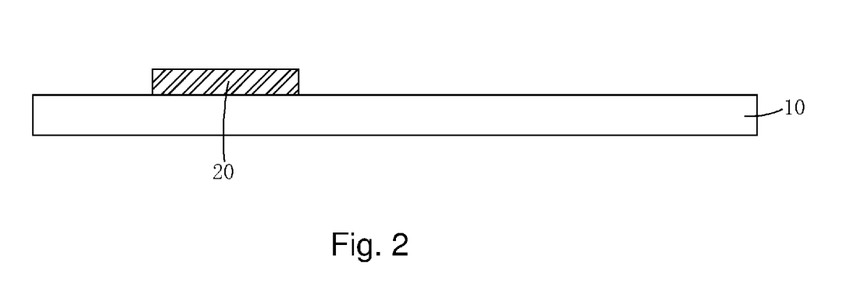
FIGS. 2-10 are schematic views illustrating step 1 of the method for manufacturing an eye-protecting liquid crystal display device according to the present invention.

Referring to FIG. 2-10, in Step 1, a process for preparing the array substrate 100 specifically comprises the following steps:

Step 11: as shown in FIG. 2, providing a first backing plate 10, depositing a first metal layer on the first backing plate 10, and subjecting the first metal layer to patterning treatment so as to form a light-shielding layer 20.

Specifically, the first backing plate 10 comprises a transparent plate, preferably a glass plate.

Figure 3:
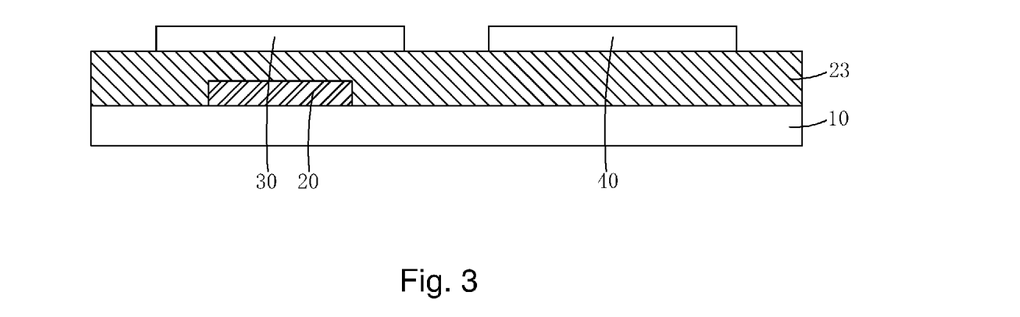

Step 12: as shown in FIG. 3, forming a buffer layer 23 on the light-shielding layer 20 and the first backing plate 10, forming a poly-silicon layer on the buffer layer 23, applying a photolithographic operation to subject the poly-silicon layer to patterning treatment so as to form a first poly-silicon section 30 located above and corresponding to the light-shielding layer 20 and a second poly-silicon section 40 spaced from the first poly-silicon section 30.

Arranging the first poly-silicon section 30 above the light-shielding layer 20 helps effectively prevent light from entering a channel zone of the first poly-silicon section 30 so as to provide advantages of lowering down leakage current and improving electrical performance of a thin-film transistor (TFT) device.

Figure 4:
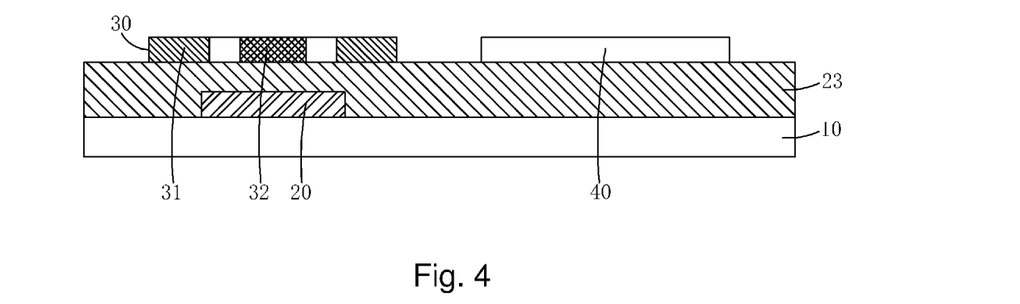

Step 13: as shown in FIG. 4, subjecting a middle portion of the first poly-silicon section 30 to P-type light doping so as to form a first channel zone 32, and then, subjecting two opposite end portions of the first poly-silicon section 30 to N-type heavy doping to form N-type heavily doped zones 31 respectively located at the two ends.

Figure 5:
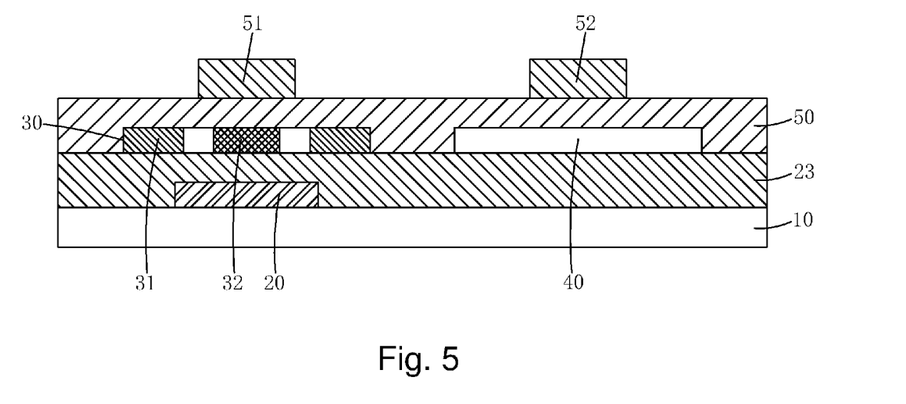

Step 14: as shown in FIG. 5, depositing a gate insulation layer 50 on the first poly-silicon section 30, the second poly-silicon section 40, and the buffer layer 23, depositing a second metal layer on the gate insulation layer 50, and subjecting the second metal layer to patterning treatment so as to form a first gate electrode 51 and a second gate electrode 52 respectively located above and corresponding to the first poly-silicon section 30 and the second poly-silicon section 40.

Figure 6:
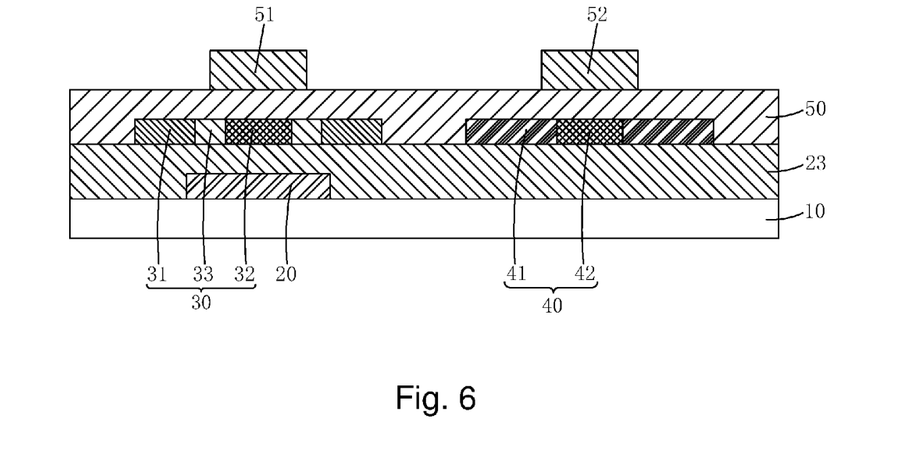

Step 15: as shown in FIG. 6, subjecting portions of the first poly-silicon section 30 that are located between the first channel zone 32 and the N-type heavily doped zones 31 to N-type light doping so as to form lightly-doped zones 33, and then, subjecting two opposite end portions of the second poly-silicon section 40 to P-type heavy doping to form P-type heavily doped zones 41 respectively located at the two ends and a second channel zone 42 located between the two P-type heavily doped zones 41.

Figure 7:
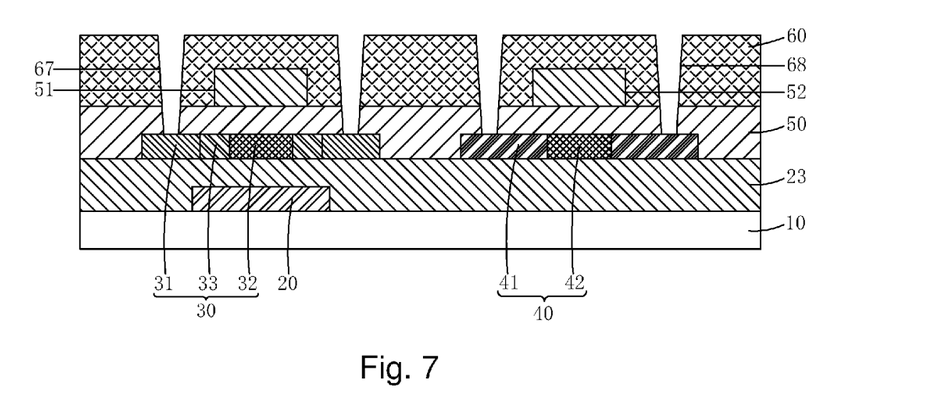

Step 16: as shown in FIG. 7, depositing an interlayer insulation layer 60 on the first gate electrode 51, the second gate electrode 52, and the gate insulation layer 50, applying a photolithographic operation to subject the interlayer insulation layer 60 and the gate insulation layer 50 to patterning treatment so as to form, in the interlayer insulation layer 60 and the gate insulation layer 50, first vias 67 respectively located above and corresponding to the N-type heavily doped zones 31 and second vias 68 respectively located above and corresponding to the P-type heavily doped zones 41.

Figure 8:
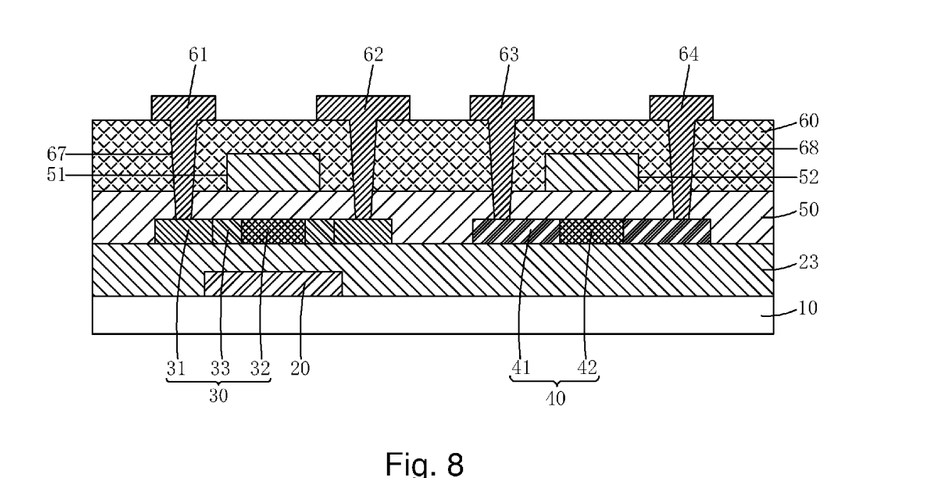

Step 17: as shown in FIG. 8, depositing a third metal layer on the interlayer insulation layer 60 and subjecting the third metal layer to patterning treatment so as to form a first source electrode 61, a first drain electrode 62, a second source electrode 63, and a second drain electrode 64 that are spaced from each other, wherein the first source electrode 61 and the first drain electrode 62 are respectively in engagement with the N-type heavily doped zones 31 through the first vias 67 and the second source electrode 63 and the second drain electrode 64 are respectively in engagement with the P-type heavily doped zones 41 through the second vias 68.

Figure 9:
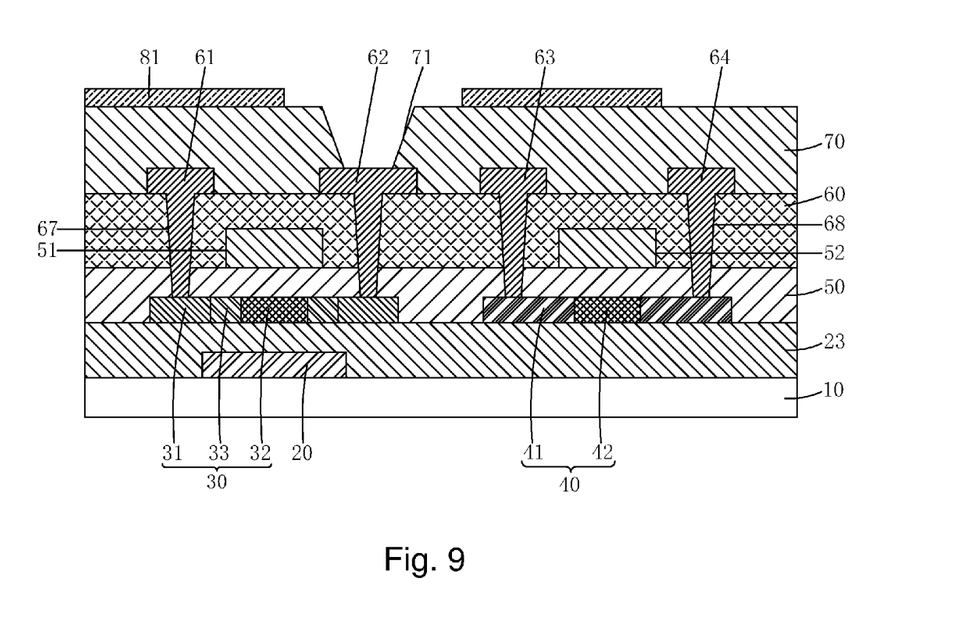

Step 18: as shown in FIG. 9, coating organic photoresist that comprises an ultraviolet light emitting material and an ultraviolet absorbent on the first source electrode 61, the first drain electrode 62, the second source electrode 63, the second drain electrode 64, and the interlayer insulation layer 60 to form a first planarization layer 70 and subjecting the first planarization layer 70 to patterning treatment so as to form, in the first planarization layer 70, a third via 71 located above and corresponding to the first drain electrode 62; and depositing a first transparent conductive layer on the first planarization layer 70 and subjecting the first transparent conductive layer to patterning treatment so as to form a common (COM) electrode 81.

Figure 10:
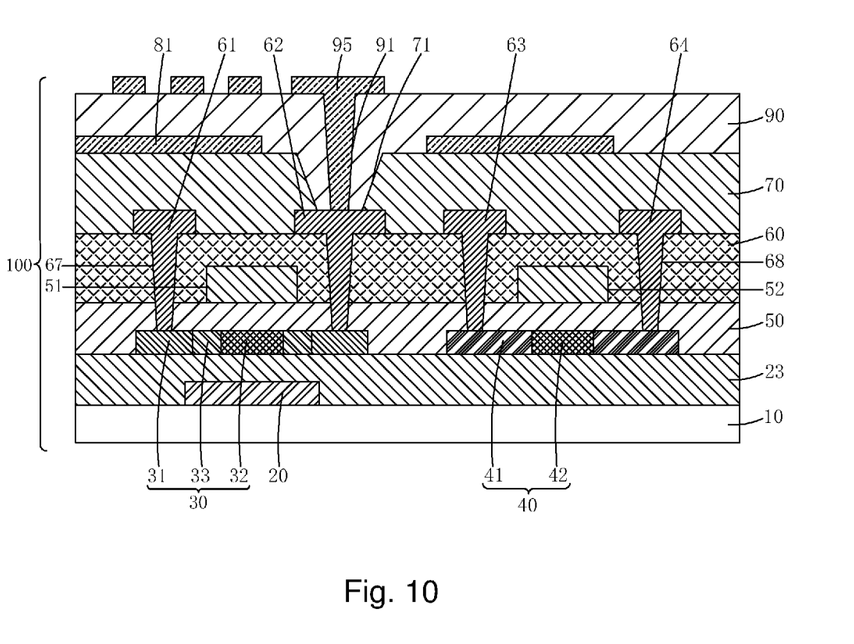

Step 19: as shown in FIG. 10, forming a passivation layer 90 on the common electrode 81 and the first planarization layer 70, and then, subjecting the passivation layer 90 to patterning treatment so as form a fourth via 91 that is located in the third via 71 and an inner wall of the fourth via 91 belongs to the passivation layer 90; and depositing a second transparent conductive layer on the passivation layer 90 and subjecting the second transparent conductive layer to patterning treatment so as to form a pixel electrode 95, wherein the pixel electrode 95 is in engagement with the first drain electrode 62 through the fourth via 91.

Specifically, the first metal layer, the second metal layer, and the third metal layer are each form of a material comprising one of molybdenum, titanium, aluminum, and copper or a stacked combination of multiple ones thereof.

Specifically, the buffer layer 23, the gate insulation layer 50, and the interlayer insulation layer 60 are each formed of a silicon oxide layer, a silicon nitride layer, or a composite layer comprising a silicon oxide layer and a silicon nitride layer stacked on each other.

Specifically, the passivation layer 90 is formed of a material comprising silicon oxide or silicon nitride.

Specifically, the first transparent conductive layer and the second transparent conductive layer are each formed of a material comprising a transparent metal oxide and the transparent metal oxide can be one or more of indium tin oxide, indium zinc oxide, aluminum tin oxide, aluminum zinc oxide, and indium germanium zinc oxide.

Specifically, ions that are used for implantation in P-type light doping and P-type heavy doping can be boron (B) ions or gallium (Ga) ions; and ions that are used for implantation in N-type light doping and N-type heavy doping can be phosphorous (P) ions or arsenic (As) ions.

Specifically, the first source electrode 61, the first drain electrode 62, the first gate electrode 51, and the first poly-silicon section 30 collectively constitute a negative channel metal oxide semiconductor (NMOS) transistor; and the second source electrode 63, the second drain electrode 64, the second gate electrode 52, and the second poly-silicon section 40 collectively constitute a positive channel metal oxide semiconductor (PMOS) transistor.

In the above-described process for preparing the array substrate 100, by adding the ultraviolet light emitting material and the ultraviolet absorbent in the first planarization layer 70, ultraviolet light and short-wavelength blue light having a wavelength less than 400 nm, which could damage human eyes, are converted into long-wavelength visible blue light having a wavelength greater than 400 nm that does not damage human eyes so that human eyes can be protected, while the display brightness of the liquid crystal display panel does not deteriorate and backlighting efficiency and transmittance of the liquid crystal display device can be ensured.

Referring to FIG. 11-12, in Step 2, a process for preparing the color filter substrate 200 specifically comprises the following steps:

Step 21: as shown in FIG. 11, providing a second backing plate 210, forming a black matrix 220 on the second backing plate 210, and forming a color resist layer 230 on the black matrix 220 and the second backing plate 210.

Specifically, the second backing plate 210 comprises a transparent plate, preferably a glass plate.

The color resist layer 230 comprises a plurality of red resist blocks 231, a plurality of green resist blocks 232, and a plurality of blue resist blocks 233. Further, the color resist layer 20 may also comprise a plurality of white resist blocks. The sequence of forming the red resist blocks 231, the plurality of green resist blocks 232, the plurality of blue resist blocks 233, and the plurality of white resist blocks is not constrained and may be varied according to actual requirement.

Step 22: as shown in FIG. 12, coating organic photoresist that contains an ultraviolet light emitting material and an ultraviolet absorbent on the color resist layer 230, forming a second planarization layer 240, and forming a plurality of photo spacers 250 on the second planarization layer 240.

Specifically, the plurality of photo spacers 250 comprises a plurality of primary photo spacers 251 and a plurality of secondary photo spacers 252. The primary photo spacers 251 have a height that is greater than a height of the secondary photo spacers 42.

In the above-described process for preparing the color filter substrate 200, by adding the ultraviolet light emitting material and the ultraviolet absorbent in the second planarization layer 240, ultraviolet light and short-wavelength blue light having a wavelength less than 400 nm, which could damage human eyes, are converted into long-wavelength visible blue light having a wavelength greater than 400 nm that does not damage human eyes so that human eyes can be protected, while the display brightness of the liquid crystal display panel does not deteriorate and backlighting efficiency and transmittance of the liquid crystal display device can be ensured.

In summary, the present invention provides a method for manufacturing an eye-protecting liquid crystal display device, in which ultraviolet light emitting materials and the ultraviolet absorbents are added in the first planarization layer 70 of the array substrate 100 and the second planarization layer 240 of the color filter substrate 200 to allow the ultraviolet absorbents to absorb short-wavelength blue light having a wavelength less than 400 nm and ultraviolet light emitting from the backlight module and allow the short-wavelength blue light and the ultraviolet light so absorbed to excite the ultraviolet light emitting materials to give off long-wavelength visible blue light having a wavelength greater than 400 nm. In order other, the first planarization layer 70 and the second planarization layer 240 are useful in converting ultraviolet light and short-wavelength blue light having a wavelength less than 400 nm, which could damage human eyes, into long-wavelength visible blue light having a wavelength greater than 400 nm that does not damage human eyes so that human eyes can be protected, while the display brightness of the liquid crystal display panel does not deteriorate and backlighting efficiency and transmittance of the liquid crystal display device can be ensured.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing an eye-protecting liquid crystal display device, comprising the following steps:
   (1) preparing an array substrate, wherein the array substrate comprises a first backing plate; a light-shielding layer located on the first backing plate; a buffer layer located on the light-shielding layer and the plate; a first poly-silicon section and a second poly-silicon section located on the buffer layer; a gate insulation layer located on the first poly-silicon section, the second poly-silicon section, and the buffer layer; a first gate electrode and a second gate electrode located on the gate insulation layer; an interlayer insulation layer located on the first gate electrode, the second gate electrode, and the gate insulation layer; a first source electrode, a first drain electrode, a second source electrode, and a second drain electrode located on the interlayer insulation layer; a first planarization layer located on the first source electrode, the first drain electrode, the second source electrode, the second drain electrode, and the interlayer insulation layer; a common electrode located on the first planarization layer; a passivation layer located on the common electrode and the first planarization layer; and a pixel electrode located on the passivation layer, wherein the first planarization layer comprises an ultraviolet light emitting material and an ultraviolet absorbent;
   (2) preparing a color filter substrate, wherein the color filter substrate comprises a second backing plate; a black matrix arranged on the second backing plate; a color resist layer arranged on the black matrix and the second backing plate; a second planarization layer arranged on the color resist layer; and a plurality of photo spacers arranged on the second planarization layer, wherein the second planarization layer comprises an ultraviolet light emitting material and an ultraviolet absorbent; and
   (3) laminating the array substrate and the color filter substrate to each other and filling liquid crystal molecules between the array substrate and the color filter substrate, followed by sealing, to form an eye-protecting liquid crystal display panel; and providing a backlight module and combining the eye-protecting liquid crystal display panel and the backlight module together to form an eye-protecting liquid crystal display device; wherein the ultraviolet absorbents contained in the first planarization layer of the array substrate and the second planarization layer of the color filter substrate absorb short-wavelength blue light having a wavelengths less than 400 nm and ultraviolet light emitting from the backlight module; and the short-wavelength blue light and the ultraviolet light so absorbed excite the ultraviolet light emitting materials to give off long-wavelength visible blue light having a wavelength greater than 400 nm, so as to provide a function of eye protection, while avoiding lowering display brightness of the liquid crystal display panel thereby ensuring the backlighting efficiency and transmittance of the liquid crystal display device;

wherein the ultraviolet light emitting materials comprise an inorganic ultraviolet light emitting material or an organic ultraviolet light emitting material;

wherein the inorganic ultraviolet light emitting material comprises one of 3Ca3(PO4)2.Ca(F,Cl)2: Sb,Mn, Y2O3:Eu, MgAl11O19: Ce,Tb, BaMg2Al16O27:Eu, manganese activated magnesium fluogermanate powder, tin activated zincstrontium phosphate powder, YVO4:Eu, Y(PV)O4:Eu, (BaSi2O3):Pb, (Ca, Zn)3 (PO4)2:Tl, Sr2P2O7:Eu, MgGa2O4:Mn, and Zn2SiO4:Mn or a combination of multiple ones thereof; and wherein the organic ultraviolet light emitting material comprises one of distyryl-biphenyl disulfonic acid sodium salt, 2,5-bis (5-tert butyl-2-benzoxazolyl) thiophene, 1-(p-sulfonamidophenyl)-3-(p-chlorophenyl)-2-pyrazoline, and phthalimide or a combination of multiple ones thereof.

2. The method for manufacturing an eye-protecting liquid crystal display device as claimed in claim 1, wherein the ultraviolet absorbents comprise an organic ultraviolet absorbent or an inorganic ultraviolet absorbent.

3. The method for manufacturing an eye-protecting liquid crystal display device as claimed in claim 2, wherein the organic ultraviolet absorbent comprises one of 2-(2'-hydroxy-3',5'-di-tert-butylphenyl)-5-chlorobenzotriazole, 2-hydroxy-4-n-octoxybenzophenone, 2-hydroxy-4-methoxybenophenone, 2(2-hydroxy-5-tert-octylphenyl)benzotriazole, and 2-(2'-hydroxy-3',5'-di-tert-amylphenyl)benzotriazole or a combination of multiple ones thereof.

4. The method for manufacturing an eye-protecting liquid crystal display device as claimed in claim 2, wherein the inorganic ultraviolet absorbent comprises one of nano-zinc oxide, nano-tin oxide, nano-indium tin oxide, and nano-tin antimony oxide or a combination of multiple ones thereof.

5. The method for manufacturing an eye-protecting liquid crystal display device as claimed in claim 1, wherein in step (1), a process for preparing the array substrate comprises the following steps:

(11) providing a first backing plate, depositing a first metal layer on the first backing plate, and subjecting the first metal layer to patterning treatment so as to form a light-shielding layer;

(12) forming a buffer layer on the light-shielding layer and the first backing plate, forming a poly-silicon layer on the buffer layer, applying a photolithographic operation to subject the poly-silicon layer to patterning treatment so as to form a first poly-silicon section located above and corresponding to the light-shielding layer and a second poly-silicon section spaced from the first poly-silicon section;

(13) subjecting a middle portion of the first poly-silicon section to P-type light doping so as to form a first channel zone, and then, subjecting two opposite end portions of the first poly-silicon section to N-type heavy doping to form N-type heavily doped zones respectively located at the two ends;

(14) depositing a gate insulation layer on the first poly-silicon section, the second poly-silicon section, and the buffer layer, depositing a second metal layer on the gate insulation layer, and subjecting the second metal layer to patterning treatment so as to form a first gate electrode and a second gate electrode respectively located above and corresponding to the first poly-silicon section and the second poly-silicon section;

(15) subjecting portions of the first poly-silicon section that are located between the first channel zone and the N-type heavily doped zones to N-type light doping so as to form lightly-doped zones, and then, subjecting two opposite end portions of the second poly-silicon section to P-type heavy doping to form P-type heavily doped zones respectively located at the two ends and a second channel zone located between the two P-type heavily doped zones;

(16) depositing an interlayer insulation layer on the first gate electrode, the second gate electrode, and the gate insulation layer, applying a photolithographic operation to subject the interlayer insulation layer and the gate insulation layer to patterning treatment so as to form, in the interlayer insulation layer and the gate insulation layer, first vias respectively located above and corresponding to the N-type heavily doped zones and second vias respectively located above and corresponding to the P-type heavily doped zones;

(17) depositing a third metal layer on the interlayer insulation layer and subjecting the third metal layer to patterning treatment so as to form a first source electrode, a first drain electrode, a second source electrode, and a second drain electrode that are spaced from each other, wherein the first source electrode and the first drain electrode are respectively in engagement with the N-type heavily doped zones through the first vias and the second source electrode and the second drain electrode are respectively in engagement with the P-type heavily doped zones through the second vias;

(18) coating organic photoresist that comprises an ultraviolet light emitting material and an ultraviolet absorbent on the first source electrode, the first drain electrode, the second source electrode, the second drain electrode, and the interlayer insulation layer to form a first planarization layer and subjecting the first planarization layer to patterning treatment so as to form, in the first planarization layer, a third via located above and corresponding to the first drain electrode; and depositing a first transparent conductive layer on the first planarization layer and subjecting the first transparent conductive layer to patterning treatment so as to form a common electrode; and (19) forming a passivation layer on the common electrode and the first planarization layer, and then, subjecting the passivation layer to patterning treatment so as form a fourth via that is located in the third via and an inner wall of the fourth via belongs to the passivation layer; and depositing a second transparent conductive layer on the passivation layer and subjecting the second transparent conductive layer to patterning treatment so as to form a pixel electrode, wherein the pixel electrode is in engagement with the first drain electrode through the fourth via.

6. The method for manufacturing an eye-protecting liquid crystal display device as claimed in claim 5, wherein the first metal layer, the second metal layer, and the third metal layer are each form of a material comprising one of molybdenum, titanium, aluminum, and copper or a stacked combination of multiple ones thereof; the buffer layer, the gate insulation layer, and the interlayer insulation layer are each formed of a silicon oxide layer, a silicon nitride layer, or a composite layer comprising a silicon oxide layer and a silicon nitride layer stacked on each other; and the first transparent conductive layer and the second transparent conductive layer are each formed of a material comprising a transparent metal oxide.

7. The method for manufacturing an eye-protecting liquid crystal display device as claimed in claim 1, wherein in step (2), a process for preparing the color filter substrate comprises the following steps:
(21) providing a second backing plate, forming a black matrix on the second backing plate, and forming a color resist layer on the black matrix and the second backing plate; and
(22) coating organic photoresist that contains an ultraviolet light emitting material and an ultraviolet absorbent on the color resist layer, forming a second planarization layer, and forming a plurality of photo spacers on the second planarization layer.

8. A method for manufacturing an eye-protecting liquid crystal display device, comprising the following steps:
(1) preparing an array substrate, wherein the array substrate comprises a first backing plate; a light-shielding layer located on the first backing plate; a buffer layer located on the light-shielding layer and the plate; a first poly-silicon section and a second poly-silicon section located on the buffer layer; a gate insulation layer located on the first poly-silicon section, the second poly-silicon section, and the buffer layer; a first gate electrode and a second gate electrode located on the gate insulation layer; an interlayer insulation layer located on the first gate electrode, the second gate electrode, and the gate insulation layer; a first source electrode, a first drain electrode, a second source electrode, and a second drain electrode located on the interlayer insulation layer; a first planarization layer located on the first source electrode, the first drain electrode, the second source electrode, the second drain electrode, and the interlayer insulation layer; a common electrode located on the first planarization layer; a passivation layer located on the common electrode and the first planarization layer; and a pixel electrode located on the passivation layer, wherein the first planarization layer comprises an ultraviolet light emitting material and an ultraviolet absorbent;
(2) preparing a color filter substrate, wherein the color filter substrate comprises a second backing plate; a black matrix arranged on the second backing plate; a color resist layer arranged on the black matrix and the second backing plate; a second planarization layer arranged on the color resist layer; and a plurality of photo spacers arranged on the second planarization layer, wherein the second planarization layer comprises an ultraviolet light emitting material and an ultraviolet absorbent; and
(3) laminating the array substrate and the color filter substrate to each other and filling liquid crystal molecules between the array substrate and the color filter substrate, followed by sealing, to form an eye-protecting liquid crystal display panel; and providing a backlight module and combining the eye-protecting liquid crystal display panel and the backlight module together to form an eye-protecting liquid crystal display device;
wherein the ultraviolet absorbents contained in the first planarization layer of the array substrate and the second planarization layer of the color filter substrate absorb short-wavelength blue light having a wavelengths less than 400 nm and ultraviolet light emitting from the backlight module; and the short-wavelength blue light and the ultraviolet light so absorbed excite the ultraviolet light emitting materials to give off long-wavelength visible blue light having a wavelength greater than 400 nm, so as to provide a function of eye protection, while avoiding lowering display brightness of the liquid crystal display panel thereby ensuring the backlighting efficiency and transmittance of the liquid crystal display device;
wherein the ultraviolet absorbents comprise an organic ultraviolet absorbent or an inorganic ultraviolet absorbent;
wherein the organic ultraviolet absorbent comprises one of 2-(2'-hydroxy-3',5'-di-tert-butylphenyl)-5-chlorobenzotriazole, 2-hydroxy-4-n-octoxybenzophenone, 2-hydroxy-4-methoxybenophenone, 2(2-hydroxy-5-tert-octylphenyl)benzotriazole, and 2-(2'-hydroxy-3',5'-di-tert-amylphenyl)benzotriazole or a combination of multiple ones thereof; and
wherein the inorganic ultraviolet absorbent comprises one of nano-zinc oxide, nano-tin oxide, nano-indium tin oxide, and nano-tin antimony oxide or a combination of multiple ones thereof.

9. The method for manufacturing an eye-protecting liquid crystal display device as claimed in claim 8, wherein the ultraviolet light emitting materials comprise an inorganic ultraviolet light emitting material or an organic ultraviolet light emitting material.

10. The method for manufacturing an eye-protecting liquid crystal display device as claimed in claim 9, wherein the inorganic ultraviolet light emitting material comprises one of 3Ca3(PO4)2.Ca(F,Cl)2:Sb,Mn, Y2O3:Eu, MgAl11O19:Ce,Tb, BaMg2Al16O27:Eu, manganese activated magnesium fluogermanate powder, tin activated zinc-strontium phosphate powder, YVO4:Eu, Y(PV)O4:Eu, (BaSi2O3):Pb, (Ca, Zn)3(PO4)2:Tl, Sr2P2O7:Eu, MgGa2O4:Mn, and Zn2SiO4:Mn or a combination of multiple ones thereof.

11. The method for manufacturing an eye-protecting liquid crystal display device as claimed in claim 9, wherein the organic ultraviolet light emitting material comprises one of distyryl-biphenyl disulfonic acid sodium salt, 2,5-bis (5-tert butyl-2-benzoxazolyl) thiophene, 1-(p-sulfonamidophenyl)-3-(p-chlorophenyl)-2-pyrazoline, and phthalimide or a combination of multiple ones thereof.

12. The method for manufacturing an eye-protecting liquid crystal display device as claimed in claim 8, wherein in step (1), a process for preparing the array substrate comprises the following steps:
(11) providing a first backing plate, depositing a first metal layer on the first backing plate, and subjecting the first metal layer to patterning treatment so as to form a light-shielding layer;
(12) forming a buffer layer on the light-shielding layer and the first backing plate, forming a poly-silicon layer on the buffer layer, applying a photolithographic operation to subject the poly-silicon layer to patterning treatment so as to form a first poly-silicon section located above and corresponding to the light-shielding layer and a second poly-silicon section spaced from the first poly-silicon section;
(13) subjecting a middle portion of the first poly-silicon section to P-type light doping so as to form a first channel zone, and then, subjecting two opposite end portions of the first poly-silicon section to N-type heavy doping to form N-type heavily doped zones respectively located at the two ends;

(14) depositing a gate insulation layer on the first poly-silicon section, the second poly-silicon section, and the buffer layer, depositing a second metal layer on the gate insulation layer, and subjecting the second metal layer to patterning treatment so as to form a first gate electrode and a second gate electrode respectively located above and corresponding to the first poly-silicon section and the second poly-silicon section;

(15) subjecting portions of the first poly-silicon section that are located between the first channel zone and the N-type heavily doped zones to N-type light doping so as to form lightly-doped zones, and then, subjecting two opposite end portions of the second poly-silicon section to P-type heavy doping to form P-type heavily doped zones respectively located at the two ends and a second channel zone located between the two P-type heavily doped zones;

(16) depositing an interlayer insulation layer on the first gate electrode, the second gate electrode, and the gate insulation layer, applying a photolithographic operation to subject the interlayer insulation layer and the gate insulation layer to patterning treatment so as to form, in the interlayer insulation layer and the gate insulation layer, first vias respectively located above and corresponding to the N-type heavily doped zones and second vias respectively located above and corresponding to the P-type heavily doped zones;

(17) depositing a third metal layer on the interlayer insulation layer and subjecting the third metal layer to patterning treatment so as to form a first source electrode, a first drain electrode, a second source electrode, and a second drain electrode that are spaced from each other, wherein the first source electrode and the first drain electrode are respectively in engagement with the N-type heavily doped zones through the first vias and the second source electrode and the second drain electrode are respectively in engagement with the P-type heavily doped zones through the second vias;

(18) coating organic photoresist that comprises an ultraviolet light emitting material and an ultraviolet absorbent on the first source electrode, the first drain electrode, the second source electrode, the second drain electrode, and the interlayer insulation layer to form a first planarization layer and subjecting the first planarization layer to patterning treatment so as to form, in the first planarization layer, a third via located above and corresponding to the first drain electrode; and depositing a first transparent conductive layer on the first planarization layer and subjecting the first transparent conductive layer to patterning treatment so as to form a common electrode; and (19) forming a passivation layer on the common electrode and the first planarization layer, and then, subjecting the passivation layer to patterning treatment so as form a fourth via that is located in the third via and an inner wall of the fourth via belongs to the passivation layer; and depositing a second transparent conductive layer on the passivation layer and subjecting the second transparent conductive layer to patterning treatment so as to form a pixel electrode, wherein the pixel electrode is in engagement with the first drain electrode through the fourth via.

13. The method for manufacturing an eye-protecting liquid crystal display device as claimed in claim 12, wherein the first metal layer, the second metal layer, and the third metal layer are each form of a material comprising one of molybdenum, titanium, aluminum, and copper or a stacked combination of multiple ones thereof; the buffer layer, the gate insulation layer, and the interlayer insulation layer are each formed of a silicon oxide layer, a silicon nitride layer, or a composite layer comprising a silicon oxide layer and a silicon nitride layer stacked on each other; and the first transparent conductive layer and the second transparent conductive layer are each formed of a material comprising a transparent metal oxide.

14. The method for manufacturing an eye-protecting liquid crystal display device as claimed in claim 8, wherein in step (2), a process for preparing the color filter substrate comprises the following steps:

(21) providing a second backing plate, forming a black matrix on the second backing plate, and forming a color resist layer on the black matrix and the second backing plate; and (22) coating organic photoresist that contains an ultraviolet light emitting material and an ultraviolet absorbent on the color resist layer, forming a second planarization layer, and forming a plurality of photo spacers on the second planarization layer.

* * * * *